United States Patent
Kanamori

(10) Patent No.: US 7,411,838 B2
(45) Date of Patent: Aug. 12, 2008

(54) SEMICONDUCTOR MEMORY DEVICE

(75) Inventor: Kohji Kanamori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 9 days.

(21) Appl. No.: 11/700,184

(22) Filed: Jan. 31, 2007

(65) Prior Publication Data

US 2007/0183212 A1 Aug. 9, 2007

(30) Foreign Application Priority Data

Feb. 9, 2006 (JP) ............................. 2006-032559

(51) Int. Cl.
*G11C 16/04* (2006.01)
(52) U.S. Cl. ..................... 365/185.28; 365/185.14; 365/185.18
(58) Field of Classification Search ............. 365/185.28
See application file for complete search history.

(56) References Cited

U.S. PATENT DOCUMENTS

| | | | | |
|---|---|---|---|---|
| 6,388,293 B1* | 5/2002 | Ogura et al. | ................ | 257/365 |
| 6,818,512 B1* | 11/2004 | Hsieh | .......................... | 438/267 |
| 7,052,947 B2* | 5/2006 | Ding | .......................... | 438/211 |
| 7,259,423 B2* | 8/2007 | Min et al. | .................... | 257/324 |
| 7,268,385 B2* | 9/2007 | Nishizaka et al. | ........... | 257/315 |
| 2002/0145914 A1* | 10/2002 | Ogura et al. | ........... | 365/185.28 |
| 2005/0029577 A1 | 2/2005 | Nishizaka et al. | | |
| 2005/0207199 A1* | 9/2005 | Chen et al. | ..................... | 365/51 |
| 2005/0207225 A1* | 9/2005 | Chen et al. | ............. | 365/185.17 |

FOREIGN PATENT DOCUMENTS

JP 2005-51227 2/2005

* cited by examiner

*Primary Examiner*—Son L Mai
(74) *Attorney, Agent, or Firm*—McGinn IP Law Group, PLLC

(57) ABSTRACT

A drive circuit 22 controls voltages applied to a substrate 1, selection gates SG0 and SG1, a local bit line LB2, and a control gate CGn. By respectively applying a negative voltage to the control gate CGn, a positive voltage to the selection gate SG0, a voltage lower than the voltage applied to the selection gate SG0 to the selection gate SG1, and a positive voltage to the local bit line LB2, the drive circuit 22 controls so that electrons are selectively drawn out of a floating gate FG3 to the local bit line LB2 by F-N tunneling during writing operation. Sufficient operation margin is obtained even when memory cells are miniaturized.

20 Claims, 17 Drawing Sheets

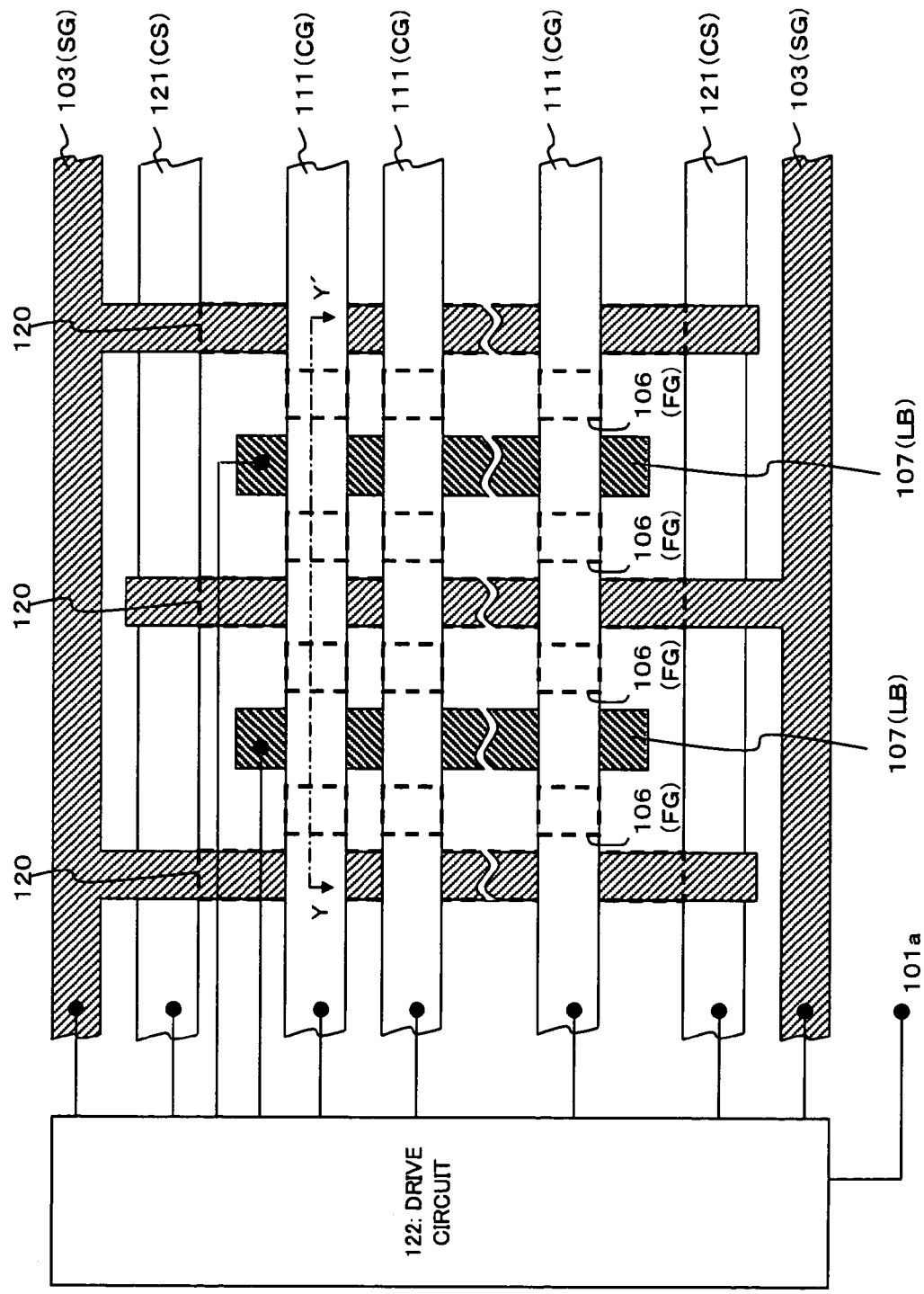

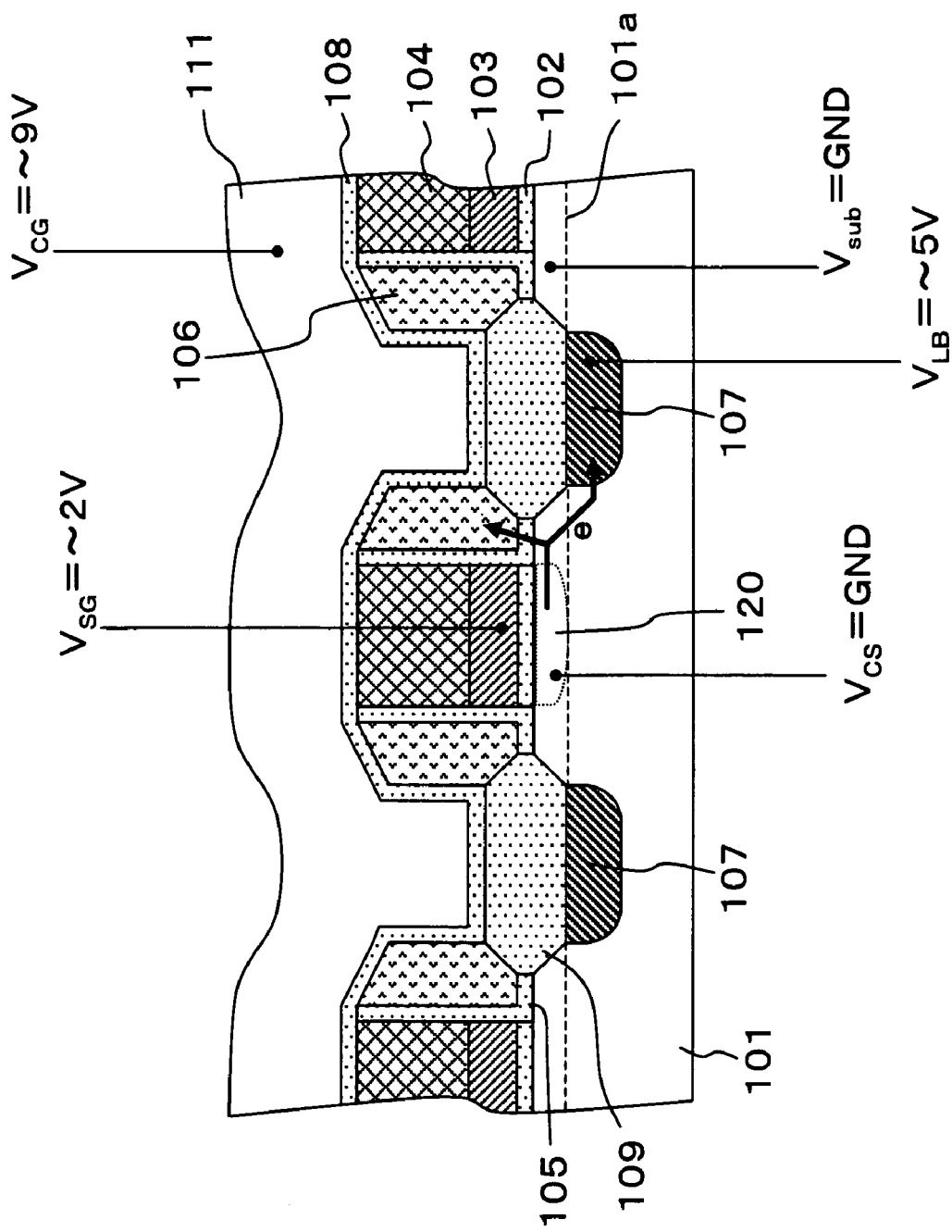

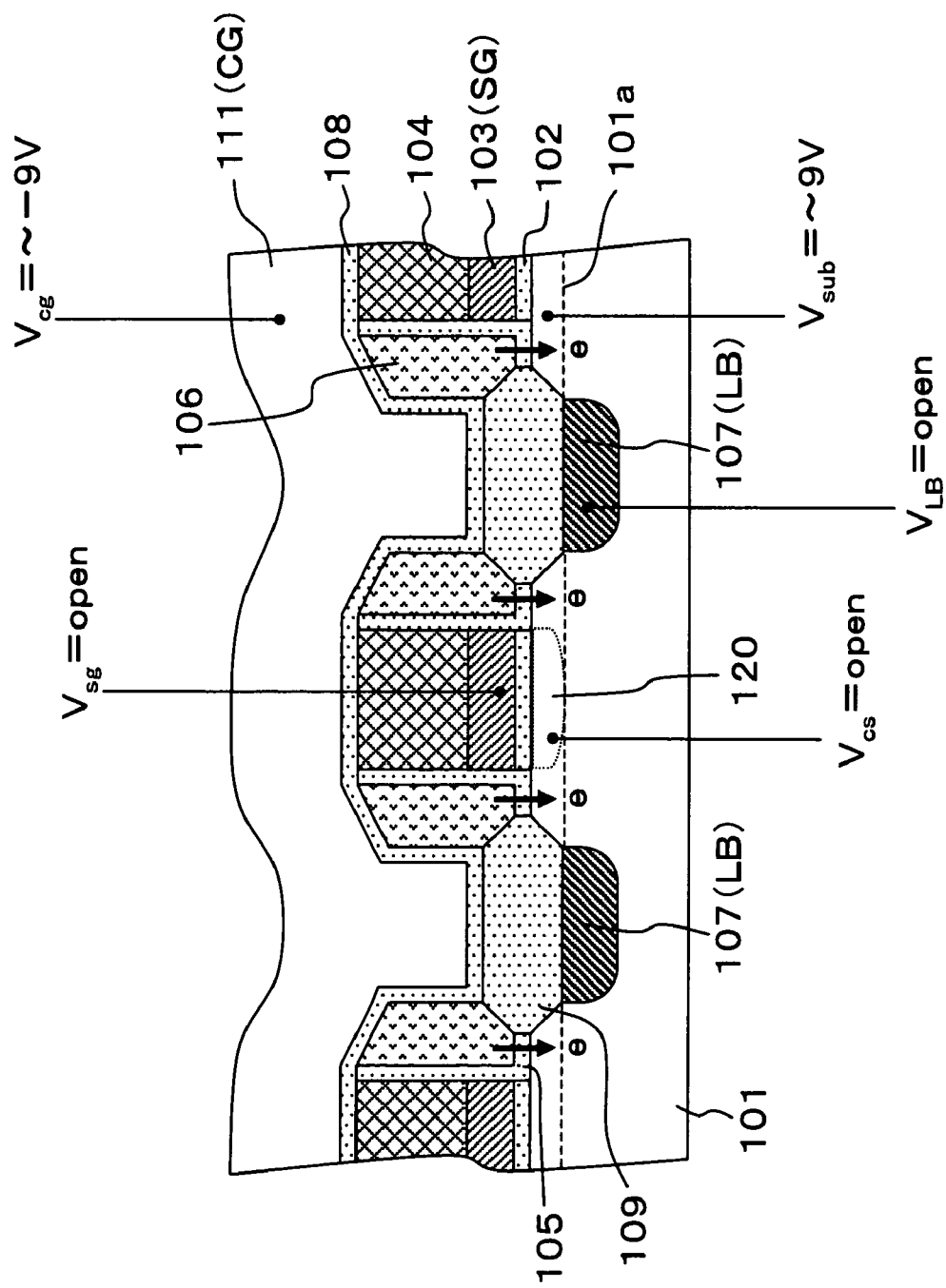

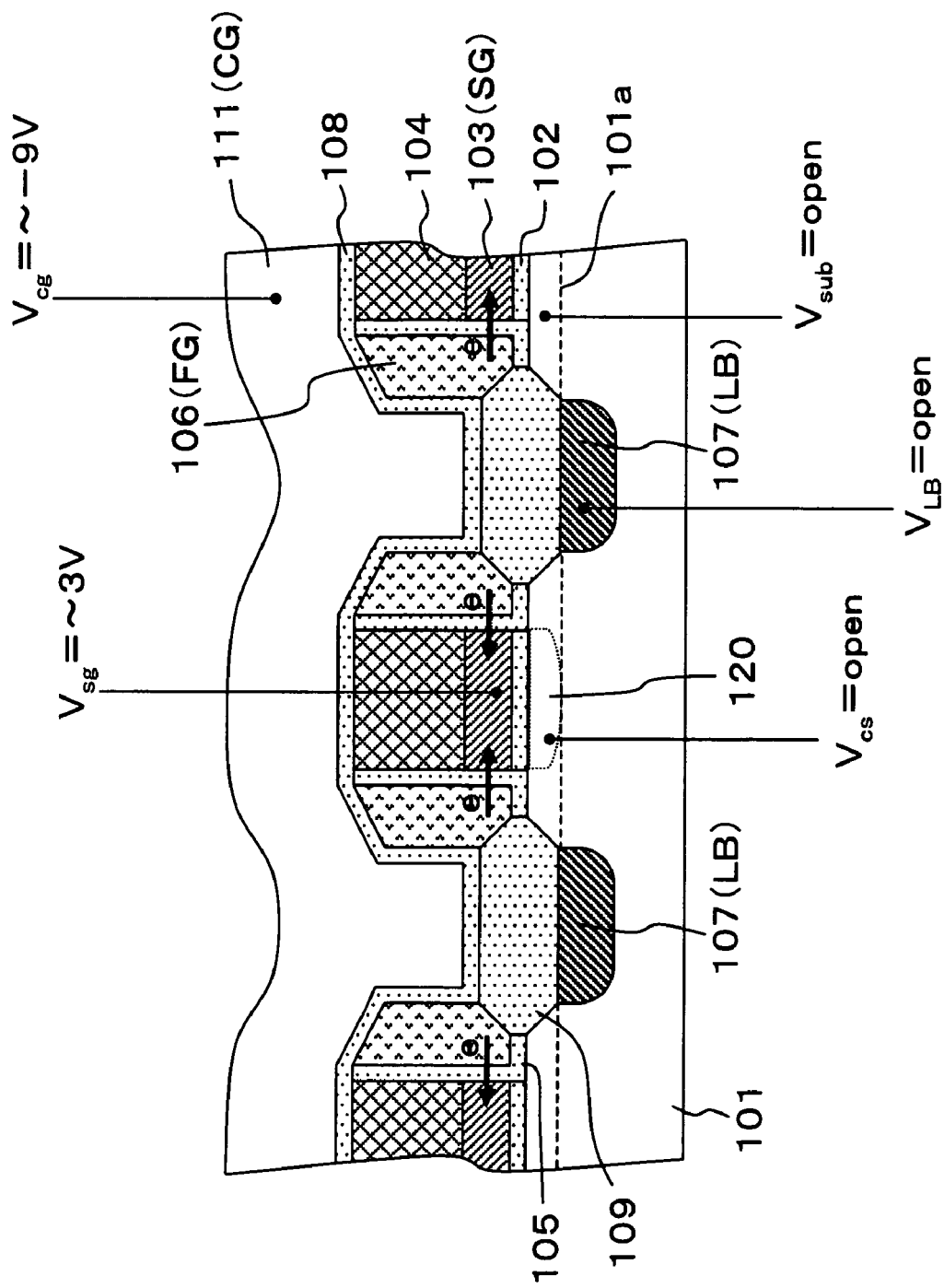

US 7,411,838 B2

SEMICONDUCTOR MEMORY DEVICE

FIELD OF THE INVENTION

The present invention relates to a semiconductor memory device, and particularly to a programmable (overwritable) nonvolatile semiconductor memory device.

BACKGROUND OF THE INVENTION

As a conventional nonvolatile semiconductor memory device, a nonvolatile semiconductor memory device shown in FIGS. 10 to 12 is known (refer to Patent Document 1; Related Art 1). The nonvolatile semiconductor memory device relating to Related Art 1 comprises a first diffusion region 107, a selection gate 103, a second diffusion region (121 in FIG. 10), a floating gate 106, and a control gate 111 in a memory cell array (refer to FIGS. 10 and 11).

The first diffusion regions 107 extend in one direction on the surface of a substrate 101, and are provided in parallel and apart from each other. The first diffusion region 107 is used as a local bit line (LB). The selection gates (SG) 103 are disposed in regions between the neighboring first diffusion regions 107 on the substrate 101 intervened with an insulating film 102, and extend in the same direction as the first diffusion region 107. The second diffusion regions (121 in FIG. 10) are disposed on the surface of the substrate 101 outside the cell region and underneath the selection gates 103, and extend in a direction crossing the selection gates 103 outside the cell region on both sides. The second diffusion region (121 in FIG. 10) is used as a common source (CS). Floating gates 106 (FG) are storage nodes and disposed in regions between the first diffusion regions 107 and the selection gates 103 intervened with the insulating film 102, and they are arranged insularly, when viewed from a direction normal to the plane. The control gates 111 (CG) are provided over the floating gates 106 and the selection gates 103 intervened with an insulating film 108, disposed in parallel and apart from each other, and extend in a direction crossing the selection gates 103. The control gates 111 are used as word lines.

A first unit cell is constituted by one of the first diffusion regions 107 (LB) disposed on both sides of the selection gate 103, a floating gate 106, a control gate 111, and a selection gate 103, and a second unit cell is constituted by the other of the first diffusion regions 107, a floating gate 106, a control gate 111, and a selection gate 103. Each of the first diffusion regions 107 is shared by a plurality of neighboring unit cells. In this nonvolatile semiconductor memory device, an inversion layer 120 is created within the cell region on the surface of the substrate 101 below the selection gate 103 when a positive voltage is applied to the selection gate 103.

Voltages applied to the first diffusion region 107, the selection gate 103, the second diffusion region 121, the control gate 111, and the substrate 101 (a well 101a) are controlled by a drive circuit 122, a part of peripheral circuits of the semiconductor memory device.

The selection gates 103 are provided in a pair of selection gates SG0 and SG1 in an erase block 123 (refer to FIG. 12). Viewed perpendicularly to the plane, SG0 and SG1 are respectively formed into a comb shape, and the comb teeth of SG0 are disposed in the spaces between the comb teeth of SG1 at a predetermined interval. SG0 and SG1 are electrically connected to all unit cells in the erase block 123. The erase block 123 is constituted by a plurality of unit cells, and a block is constituted by those unit cells where electrons are simultaneously drawn out of the floating gates 106 when an erase operation is performed (the erase operation will be described later). A plurality of the erase blocks 123 exist in one semiconductor memory device.

[Patent Document 1]
Japanese Patent Kokai Publication No. JP-P2005-51227A

SUMMARY OF THE DISCLOSURE

The disclosure of the Patent Document 1 is herein incorporated by reference thereto.

Next, the operation of the nonvolatile semiconductor memory device relating to Related Art 1 will be described with reference to the drawings. FIG. 13 is a schematic diagram for explaining a read operation of the semiconductor memory device relating to Related Art 1. FIG. 14 is a schematic diagram for explaining a write operation of the semiconductor memory device relating to Related Art 1. FIG. 15 is a schematic diagram for explaining a first erase operation of the semiconductor memory device relating to Related Art 1. FIG. 16 is a schematic diagram for explaining a second erase operation of the semiconductor memory device relating to Related Art 1. Note FIGS. 13 to 16 are based on the analysis conducted by the present invention.

Referring to FIG. 13, during the read operation, when electrons are not stored in the floating gate 106 (an erased state; a low threshold voltage), by applying positive voltages to the control gate 111, the selection gate 103, and the second diffusion region (121 in FIG. 10), electrons e run through a channel below the floating gate 106 from the first diffusion region 107. Then they run through the inversion layer 120 created below the selection gate 103, and move to the second diffusion region (121 in FIG. 10). On the other hand, in a state where the electrons are stored in the floating gate 106 (a written state; a high threshold voltage), the electrons e do not flow even when positive voltages are applied to the control gate 111, the selection gate 103, and the second diffusion region (121 in FIG. 10) since there is no channel below the floating gate 106 (not shown in the drawing). The read operation is performed by judging data (0/1) in terms of whether or not the electrons e flow.

Referring to FIG. 14, during the write operation, by applying high positive voltages to the control gate 111 and the first diffusion region 107 and applying a low positive voltage to the second diffusion region (121 in FIG. 10) so that a current of a several nA to a several μA flows through memory cells of the selection gate 103, the electrons e run from the second diffusion region (121 in FIG. 10) through the inversion layer 120 created below the selection gate 103, and flow to the first diffusion region 107. At this time, since some of the electrons e have high energy due to an electric field at the boundary between the selection gate 103 and the floating gate 106, they are injected into the floating gate 106 through an insulating film 105 (a tunnel oxide film) below the floating gate 106.

Referring to FIG. 15, during the first erase operation, a high negative voltage is applied to the control gate 111, and a high positive voltage is applied to the substrate 101 (the well 101a). For instance, a voltage $V_{cg}=-9V$ is applied to the control gate 111, a voltage $V_{sub}=9V$ is applied to the substrate 101 (the well 101a), and the first diffusion region 107, the selection gate 103, and the second diffusion region (121 in FIG. 10) are open. As a result, the electrons e are drawn out of the floating gate 106 to the substrate 101 (the well 101a), as shown by arrows e.

Referring to FIG. 16, during the second erase operation, a high negative voltage is applied to the control gate 111, and a positive voltage is applied to the selection gate 103. For instance, a voltage $V_{cg}=-9V$ is applied to the control gate 111, a voltage $V_{sg}=3V$ is applied to the selection gate 103, while the first diffusion region 107, the substrate 101 (the well 101a), and the second diffusion region (121 in FIG. 10) are open. As a result, the electrons e are drawn out of the floating gates 106 to the selection gates 103.

Erasure is performed in one operation in the erase block (123 in FIG. 12) (refer to FIG. 17B), and a rewrite (write) operation is performed on a bit or bits whose threshold voltage Vt is lower than an erase operation lower limit value (refer to FIG. 17C).

However, as the variance in the characteristics of memory cells increases due to the miniaturization of memory cells, so does the variance in the threshold voltage Vt when the batch erase operation is performed, and as a result, a sufficient operation margin—the difference in the threshold voltage Vt between the written state (refer to FIG. 17A) and the erased state (refer to FIG. 17C)—may not be able to be obtained. If the erase level is lowered in order to secure a sufficient operation margin, a large number of memory cells in the erase block will be in a depletion state (the threshold voltage Vt is not higher than 0V (L'); refer to FIG. 17B), and the rewrite operation will not be able to be performed selectively, resulting in a malfunction.

It is a main object of the present invention to provide a sufficient operation margin even when memory cells are miniaturized.

In a first aspect of the present invention, there is provided a semiconductor memory device comprising:

a first selection gate disposed in a first region on a substrate; a first storage node disposed in a second region adjacent to the first region; a local bit line disposed in a third region adjacent to the second region; a second storage node disposed in a fourth region adjacent to the third region; a second selection gate disposed in a fifth region adjacent to the fourth region on the substrate; a control gate disposed on the first storage node and the second storage node, and a drive circuit that controls voltages applied to the substrate, the first selection gate, the local bit line, the second selection gate, and the control gate. The drive circuit performs a first control to selectively draw electrons out of the first storage node to the local bit line through F-N tunneling by respectively applying a negative voltage to the control gate, a positive voltage to the second selection gate, a voltage lower than the voltage applied to the second selection gate to the first selection gate, and a positive voltage to the local bit line during a programming operation.

In a second aspect of the present invention, the drive circuit performs a second control to selectively draw electrons from the second storage node to the local bit line through F-N tunneling by respectively applying a negative voltage to the control gate, a positive voltage to the first selection gate, a voltage lower than the voltage applied to the first selection gate to the second selection gate, and a positive voltage to the local bit line after the first control.

In a third aspect, the drive circuit performs a third control to selectively inject electrons into the first storage node or the second storage node by controlling the voltages after the second control.

In a fourth aspect, the drive circuit performs a fourth control to selectively inject electrons into the second storage node by controlling the voltages after the first control.

In a fifth aspect, the drive circuit applies voltages in two or more separate pulses, verifies the state of the first storage node, and adjusts the state to a desired threshold voltage at the time of the first control.

In a sixth aspect, the drive circuit applies voltages in two or more separate pulses, verifies the state of the second storage node, and adjusts the state to a desired threshold voltage at the time of the second control.

The meritorious effects of the present invention are summarized as follows.

According to the present invention (aspects 1 to 6), threshold voltages can be adjusted for each bit during both write and read operations, and the variance in the characteristics of memory cells due to the miniaturization of memory cells can be suppressed.

BRIEF DESCRIPTION OF THE DRAWINGS

FIG. 9A shows an H state, FIG. 9B an L state, and FIG. 9C an H' state.

FIG. 10 is a partial plan view schematically showing the structure of a semiconductor memory device relating to Related Art 1.

FIG. 14 is a schematic diagram for explaining a write operation of the semiconductor memory device relating to Related Art 1.

FIG. 15 is a schematic diagram for explaining a first erase operation of the semiconductor memory device relating to Related Art 1.

FIG. 16 is a schematic diagram for explaining a second erase operation of the semiconductor memory device relating to Related Art 1.

FIG. 17A shows an H state, FIG. 17B a depletion state, and FIG. 17C an L state.

Note that FIGS. 13 to 17A, B and C are based on the analysis by the present invention.

PREFERRED MODES OF THE INVENTION

EXAMPLE 1

Figure 1:
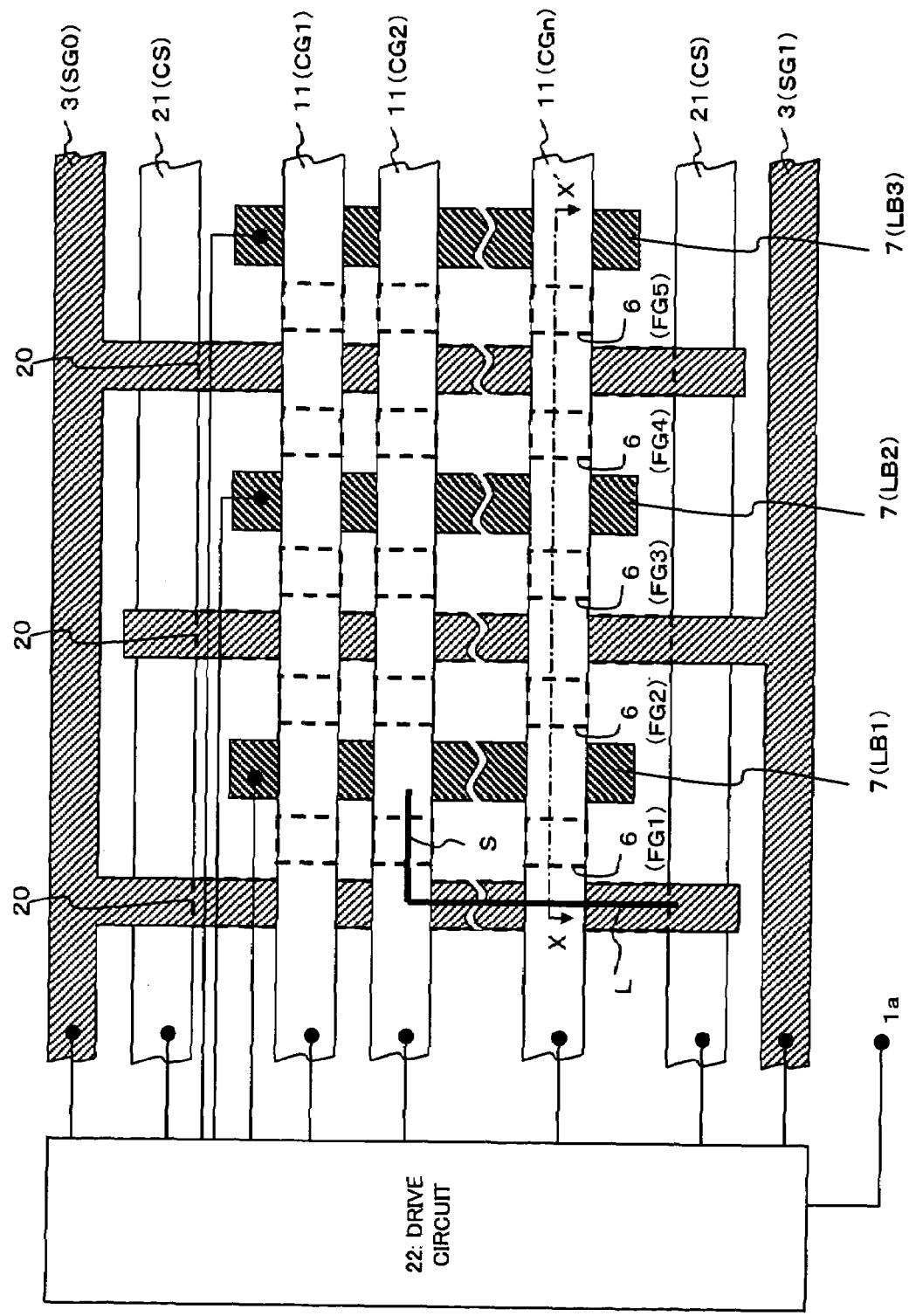
FIG. 1 is a partial plan view schematically showing the structure of a semiconductor memory device relating to Example 1 of the present invention.
Figure 2:
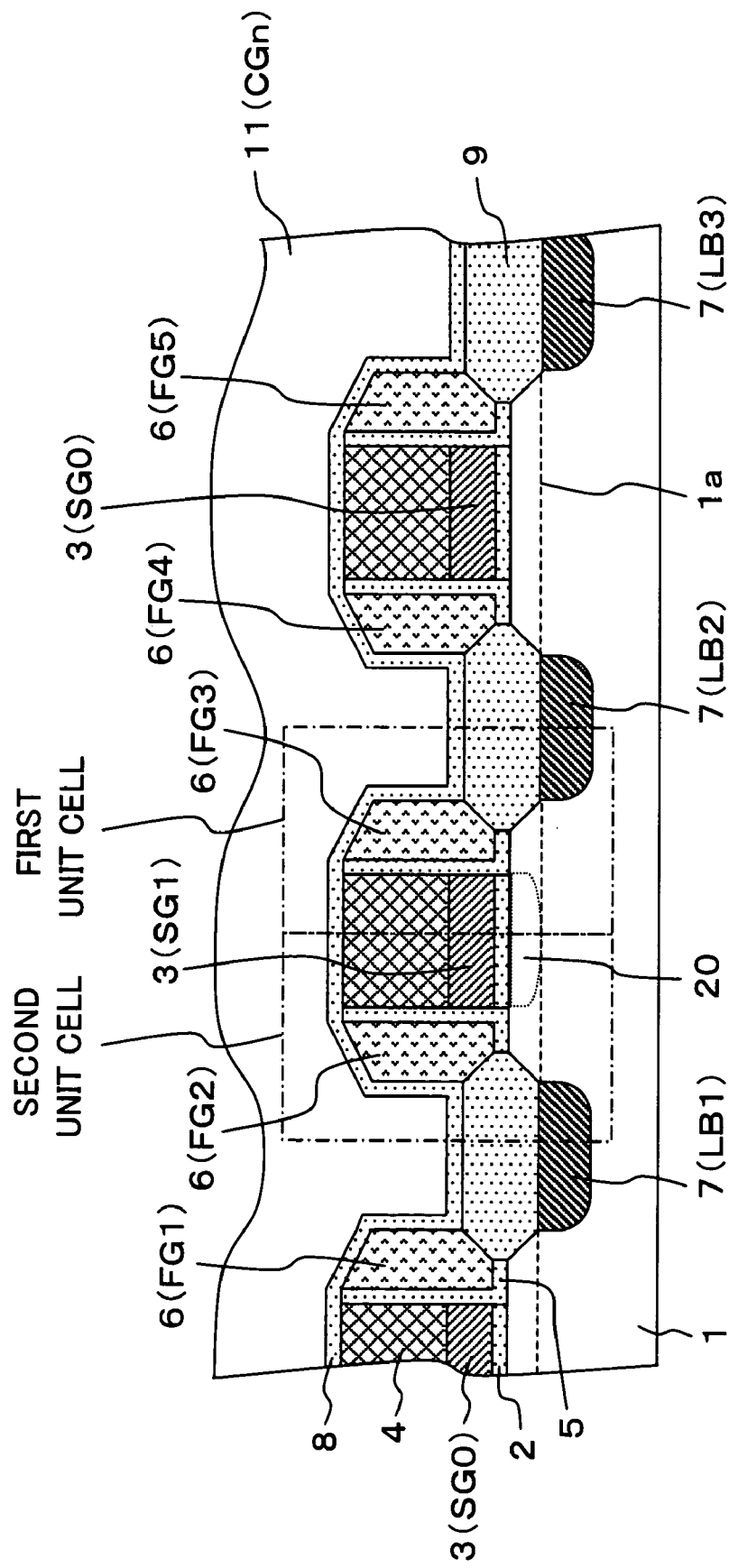
FIG. 2 is a partial cross-sectional view taken along a line X-X' in FIG. 1 schematically showing the structure of the semiconductor memory device relating to Example 1 of the present invention.

A semiconductor memory device relating to Example 1 of the present invention will be described with reference to the drawings. FIG. 1 is a partial plan view schematically showing the structure of the semiconductor memory device relating to Example 1 of the present invention. FIG. 2 is a partial cross-sectional view taken along a line X-X' in FIG. 1 schematically showing the structure of the semiconductor memory device relating to Example 1 of the present invention.

The semiconductor memory device relating to Example 1 stores two-bit information per cell. The semiconductor memory device comprises a substrate 1, an insulating film 2, selection gates 3, an insulating film 4, an insulating film 5, floating gates 6, first diffusion regions 7, an insulating film 8, an insulating film 9, control gates 11 (CG1-CGn), and second diffusion regions (21 in FIG. 1). One unit cell in the semiconductor memory device is constituted by one first diffusion region 7, one floating gate 6, a control gate 11, and a selection gate 3 as indicated by a dot-dashed line in FIG. 2. A two-bit/cell in the semiconductor memory device is constituted by two unit cells, disposed in line symmetry, sharing one selection gate 3. In other words, the other unit cell of the two-bit/cell in FIG. 2 is constituted by one first diffusion region 7, one floating gate 6, the control gate 11, and the selection gate 3.

The substrate 1 is a P-type silicon substrate. Underneath the selection gate 3 and the floating gate 6, the substrate 1 has a well 1a. The well 1a is a p⁻ diffusion region. The well 1a may be also called common source diffusion region.

On the substrate 1, when viewed from the top of the substrate 1, a channel that constitutes a passage connecting the first diffusion region 7 and the second diffusion region 21 has a first path L extending from one second diffusion region 21 in a direction defined in association with the planar shape of the selection gate 3, and a second path S extending from the end of the first path L to the first diffusion region 7 side in a second direction that forms a predetermined angle (for instance a right angle) with the first direction. Out of the first path L, a channel below the selection gate 3 in the cell region becomes an inversion layer 20 when a positive voltage is applied to the selection gate 3. In the second path S, a part below the floating gate 6 is also used as a channel region. Similarly, when viewed from the top of the substrate 1, the channel region that constitutes a passage connecting a first diffusion region 7 and a second diffusion region 21 has a first path extending from one second diffusion region 21 in the longitudinal direction of the selection gate 3, and a second path extending from the end of the first path to the first diffusion region 7 side in a second direction that forms a predetermined angle (a right angle) with the first direction. In other words the channel region is formed along the paths L and S.

The insulating film 2 is provided between the selection gate 3 and the substrate 1. As the insulating film 2, for instance a silicon dioxide film can be used. The insulating film 2 may be also called selection gate insulating film.

Figure 12:
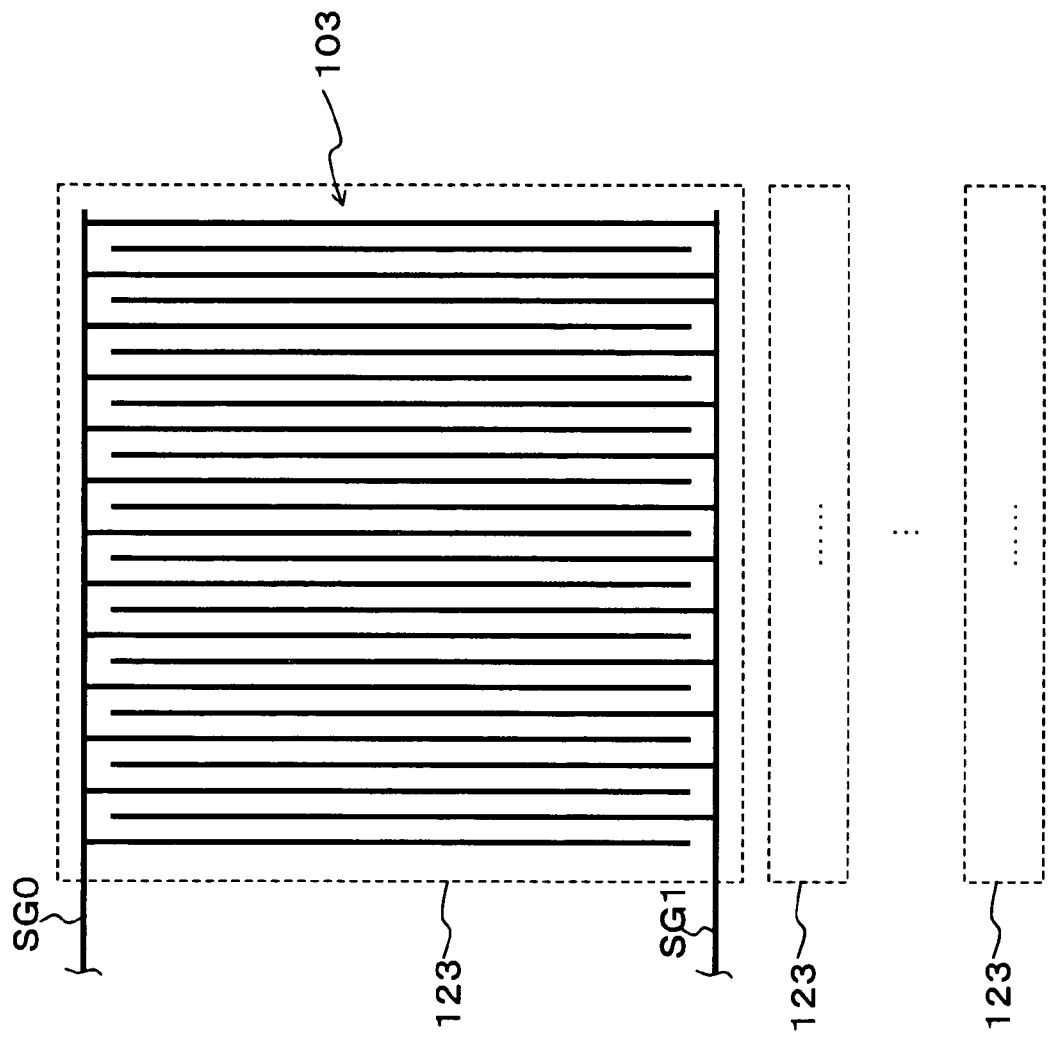
FIG. 12 is a partial plan view schematically showing the structure of a selection gate in an erase block of the semiconductor memory device relating to Related Art 1.
Figure 13:
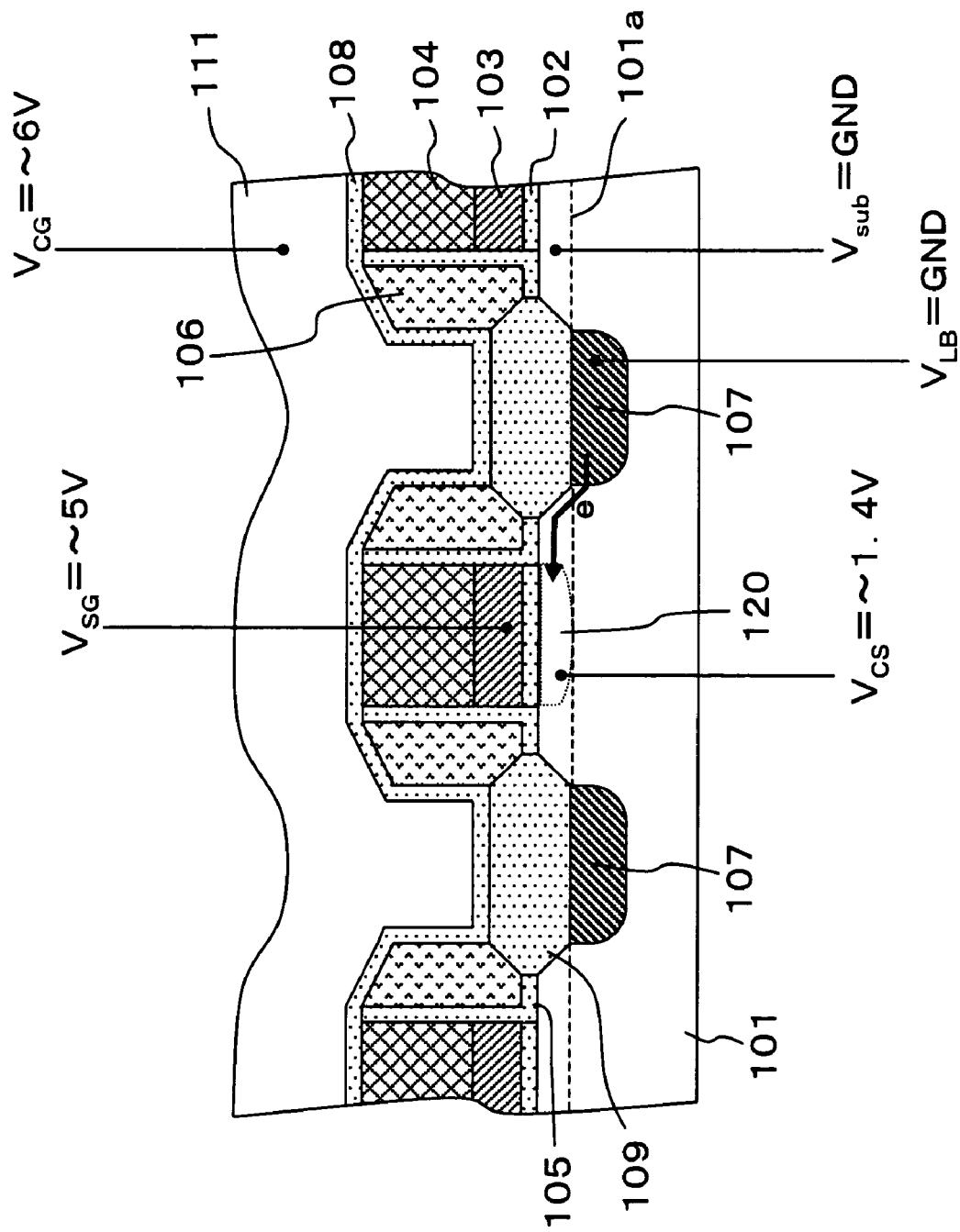
FIG. 13 is a schematic diagram for explaining a read operation of the semiconductor memory device relating to Related Art 1.
Figure 17A:
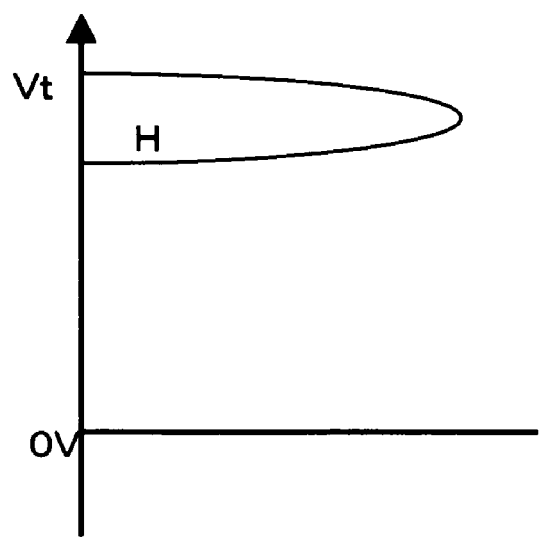
FIGS. 17A, 17B and 17C are schematic diagrams showing the threshold voltage dispersions of memory cells in the semiconductor memory device relating to Related Art 1.
Figure 17B:
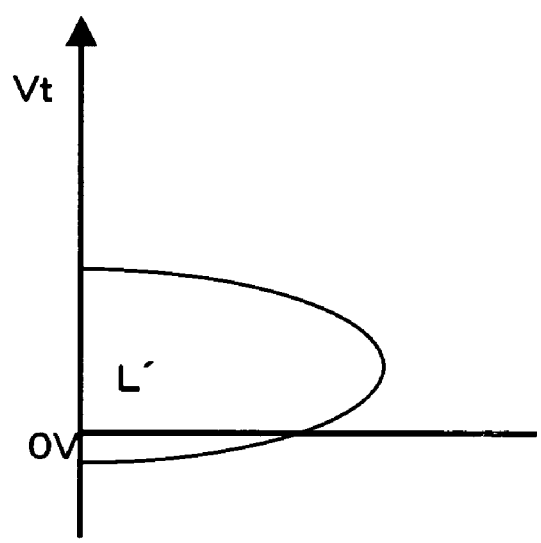
Figure 17C:
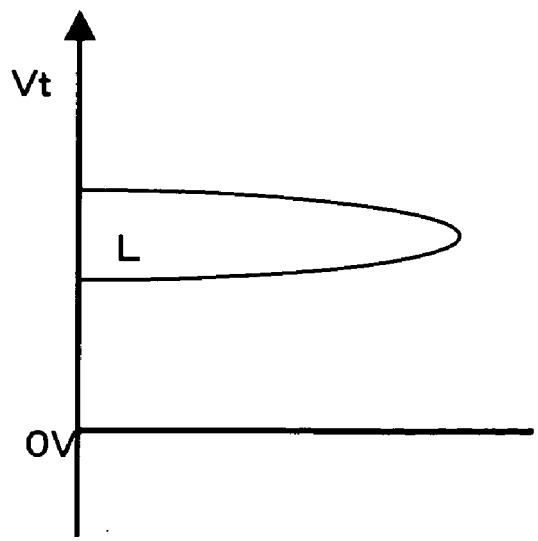

The selection gate 3 is a conductive film provided on the insulating film 2. For the selection gate 3, for instance polysilicon can be used. As in Related Art 1 (refer to FIG. 12), the selection gates 3 are formed of a pair of selection gates SG0 and SG1 in an erase block 123. Viewed perpendicularly to the plane, SG0 and SG1 are respectively formed into a comb shape. The comb teeth of SG0 are disposed in the spaces between the comb teeth of SG1 at a predetermined interval, and the comb teeth of SG1 are disposed in the spaces between the comb teeth of SG0 at a predetermined interval. SG0 and SG1 are electrically connected to all unit cells in the erase block 123. A selection gate 3 may be divided into three or more parts in one erase block 123 as long as it can be controlled so that different voltages are applied to the selection gates disposed on both sides of the first diffusion region, viewed perpendicularly to the plane.

The insulating film 4 is provided on the selection gate 3 (refer to FIG. 2). For the insulating film 4, for instance a silicon dioxide film or a silicon nitride film can be used.

The insulating film 5 is provided on the side walls of the insulating film 4, the selection gate 3, and the insulating film 2, and between the substrate 1 and the floating gate 6. For the insulating film 5, for instance a silicon dioxide film can be used (refer to FIG. 2). The insulating film 5 may be also called tunnel oxide films.

The floating gates 6 are storage nodes and provided on both sides of a selection gate structure constituted by a multilayer of the selection gate 3 and the insulating film 4 through the insulating film 5 (refer to FIG. 2). For the floating gate 6, for instance polysilicon can be used. When viewed in cross section, the floating gates 6 are formed in the form of side walls (refer to FIG. 2), and they are disposed insularly when viewed in plane (refer to FIG. 1). Note that, instead of the floating gate 6, a trap storage node may be used.

The first diffusion regions 7 are n+ diffusion regions provided in predetermined regions on the substrate 1 (spaces between the neighboring floating gates 6), and they are disposed along a direction in which the (comb-teeth part of the) selection gates 3 extend (refer to FIGS. 1 and 2). The first diffusion region 7 becomes the drain region of a cell transistor during a write operation and the source region during a read operation, depending on the relationship with the selection gate 3. The first diffusion region 7 may be also called local bit line (LB).

The insulating film 8 is an insulating film provided between the floating gate 6 and the control gate 11 (refer to FIG. 2). For the insulating film 8, for instance, an ONO film constituted by a silicon dioxide film 8a, a silicon nitride film 8b, and a silicon dioxide film 8c. The ONO film has a high insulating property and a high dielectric constant, and is regarded to be suitable for thin film formation.

The insulating film 9 is provided between the insulating film 8 and the first diffusion region 7 (refer to FIG. 2). For the insulating film 9, for instance, a silicon dioxide film (thermal oxidation film) formed by thermal oxidation or a silicon dioxide film formed by a CVD method can be used.

The control gate 11 extends in a direction orthogonal to the longitudinal direction of the selection gate 3 and three-dimensionally crosses (or cross-over) the selection gate 3 (refer to FIG. 1). The control gate 11 contacts the upper surface of the insulating film 8 provided over the selection gate 3 at the crossing with the selection gate 3 (refer to FIG. 2). The control gates 11 are provided on both sides of the selection gate structure constituted by a laminate structure of the selection gate 3 and the insulating film 4 through the insulating film 5, the floating gate 6, and the insulating film 8 (refer to FIG. 2). The control gate 11 is composed of a conductive film, and for instance polysilicon can be used. A metal silicide (not shown in the drawing) having a high melting point may be provided on the surface of the control gate 11 so that it has a low resistance. The control gate 11 becomes a word line.

The second diffusion region 21 is an n+ diffusion region and becomes the source/drain region of the cell transistor (refer to FIG. 1). The second diffusion region 21 extends in a direction orthogonal to the longitudinal direction of the selection gate 3, and it three-dimensionally crosses (cross-under) the selection gate 3 outside the cell region. The second diffusion region 21 is formed on the surface of the substrate 1 immediately below the insulating film 2 provided underneath the selection gate 3 and at the crossing with the selection gate 3 (not shown in the drawing).

A drive circuit 22 is one of peripheral circuits, and it controls voltages applied to the first diffusion regions 7, the selection gates 3, the control gates 11, the substrate 1 (the well 1a), and the second diffusion regions 21, and verifies the threshold voltage of the memory cells. The voltage control of the drive circuit 22 is different from that of the drive circuit in the nonvolatile semiconductor memory device relating to Related Art 1 at least in a programming operation. The drive circuit 22 includes a sense amplifier, a reference cell, and a decoder. The voltage control and verify operation of the drive circuit 22 during the programming operation will be described later.

Note that the semiconductor memory device relating to Example 1 is configured identically to the nonvolatile semiconductor memory device relating to Related Art 1 except for the drive circuit 22. Further, the same manufacturing method as that of the nonvolatile semiconductor memory device relating to Related Art 1 can be applied to the semiconductor memory device relating to Example 1 from the formation of the well 1a to the formation of the control gate 11.

Figure 3:
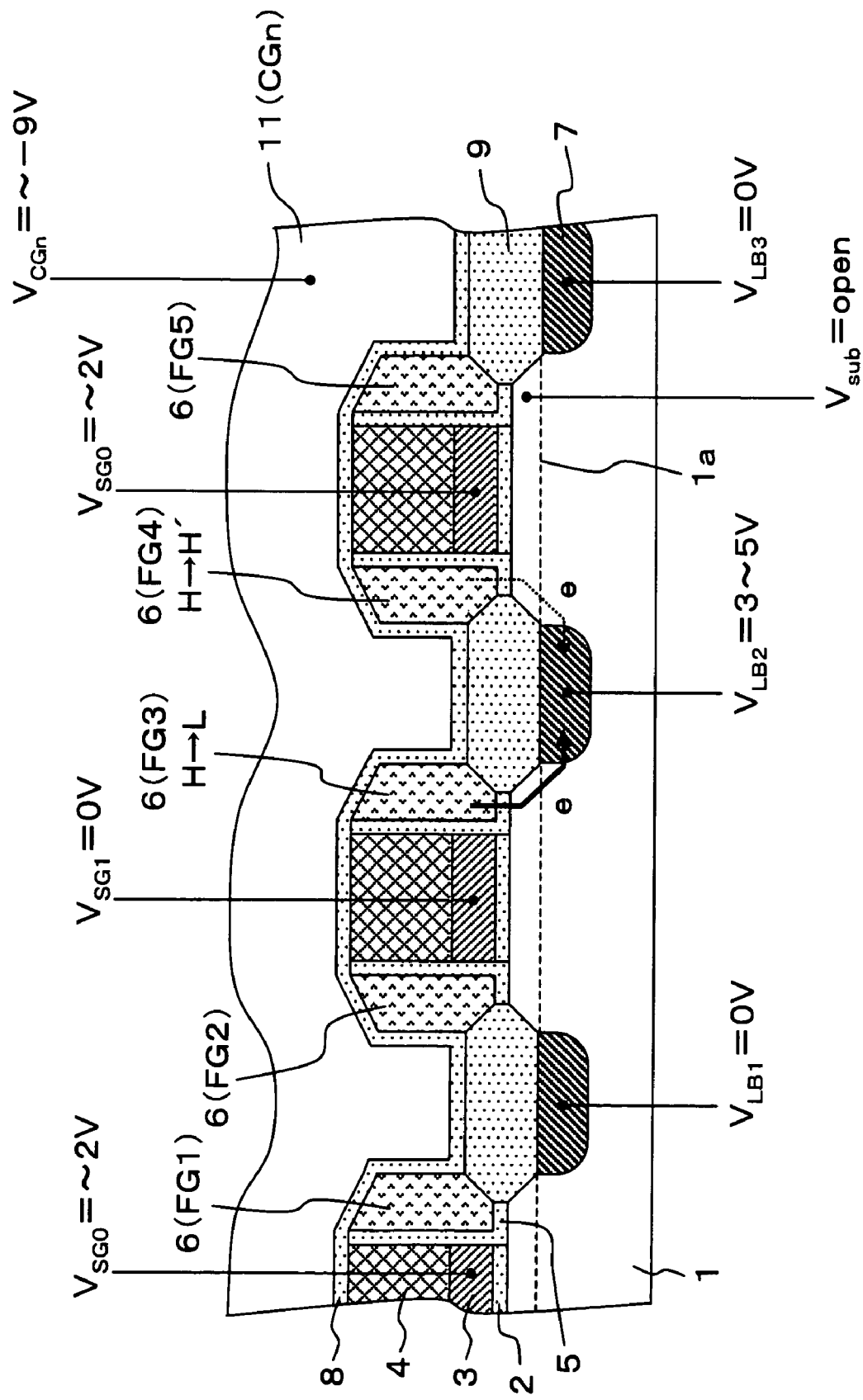
FIG. 3 is a schematic diagram for explaining how the semiconductor memory device relating to Example 1 of the present invention changes from an initial state to an L, H' state.
Figure 4:
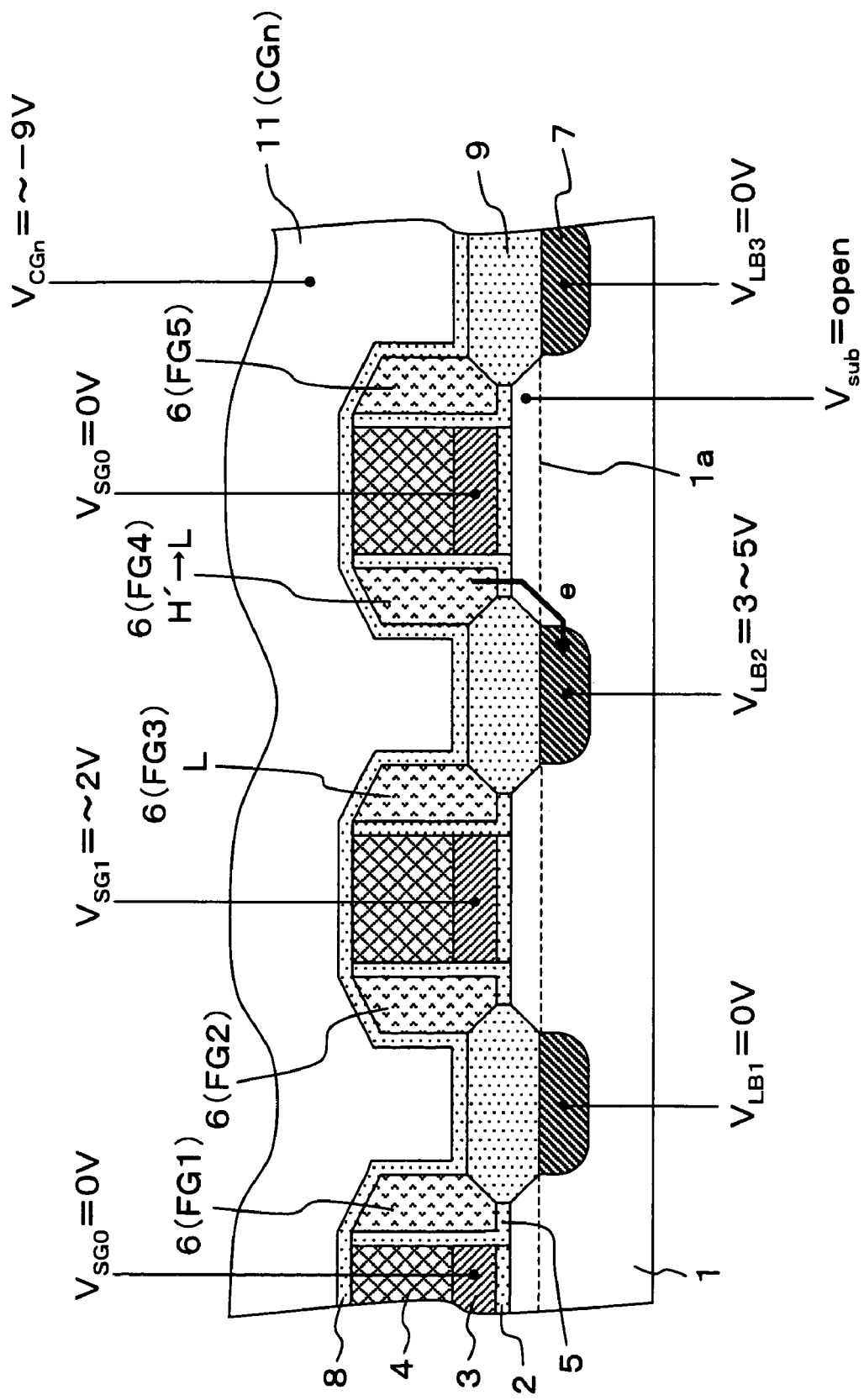
FIG. 4 is a schematic diagram for explaining how the semiconductor memory device relating to Example 1 of the present invention changes from the L, H' state to an L, L state.
Figure 5:
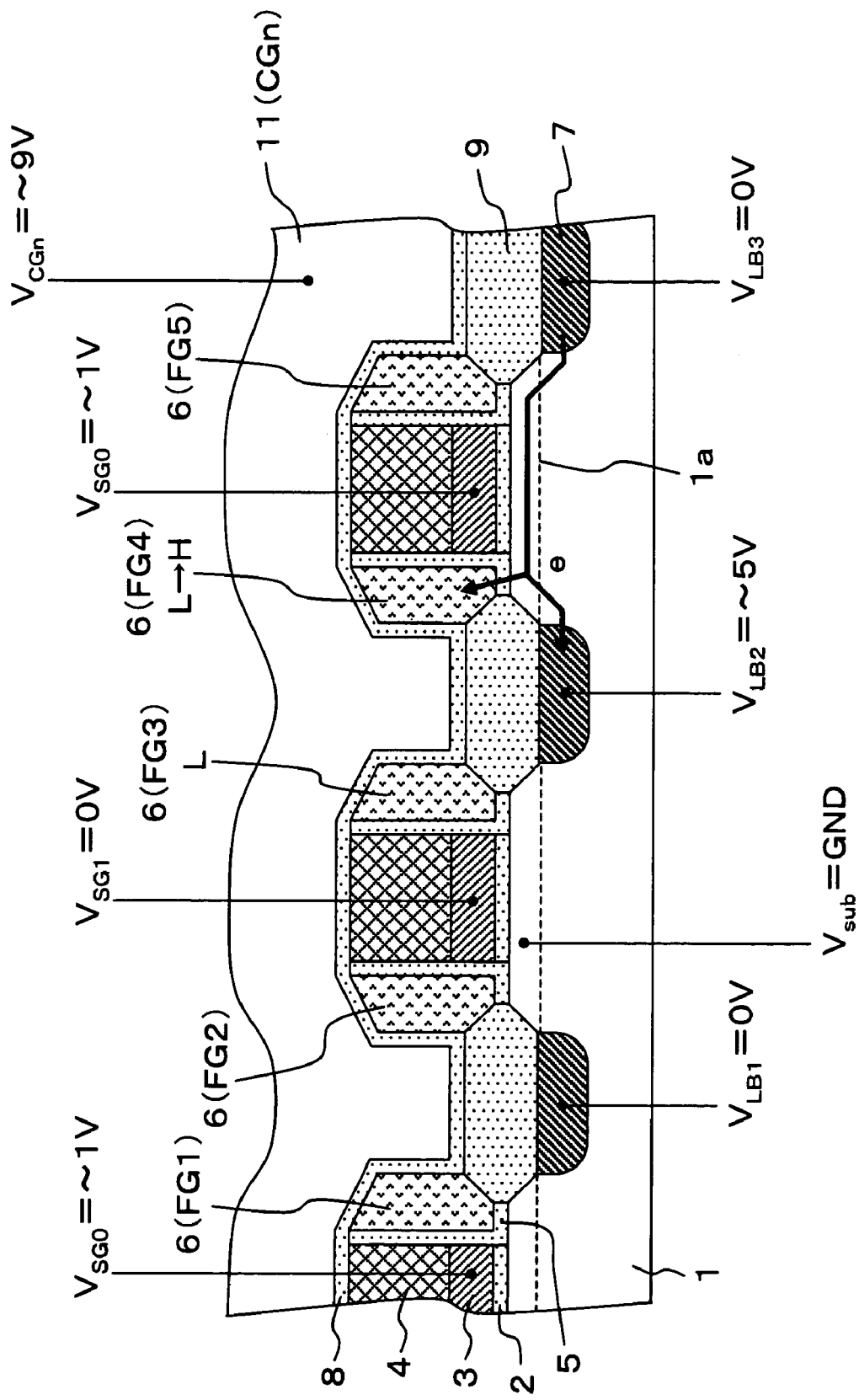
FIG. 5 is a schematic diagram for explaining how the semiconductor memory device relating to Example 1 of the present invention changes from the L, L state to an L, H state.
Figure 6:
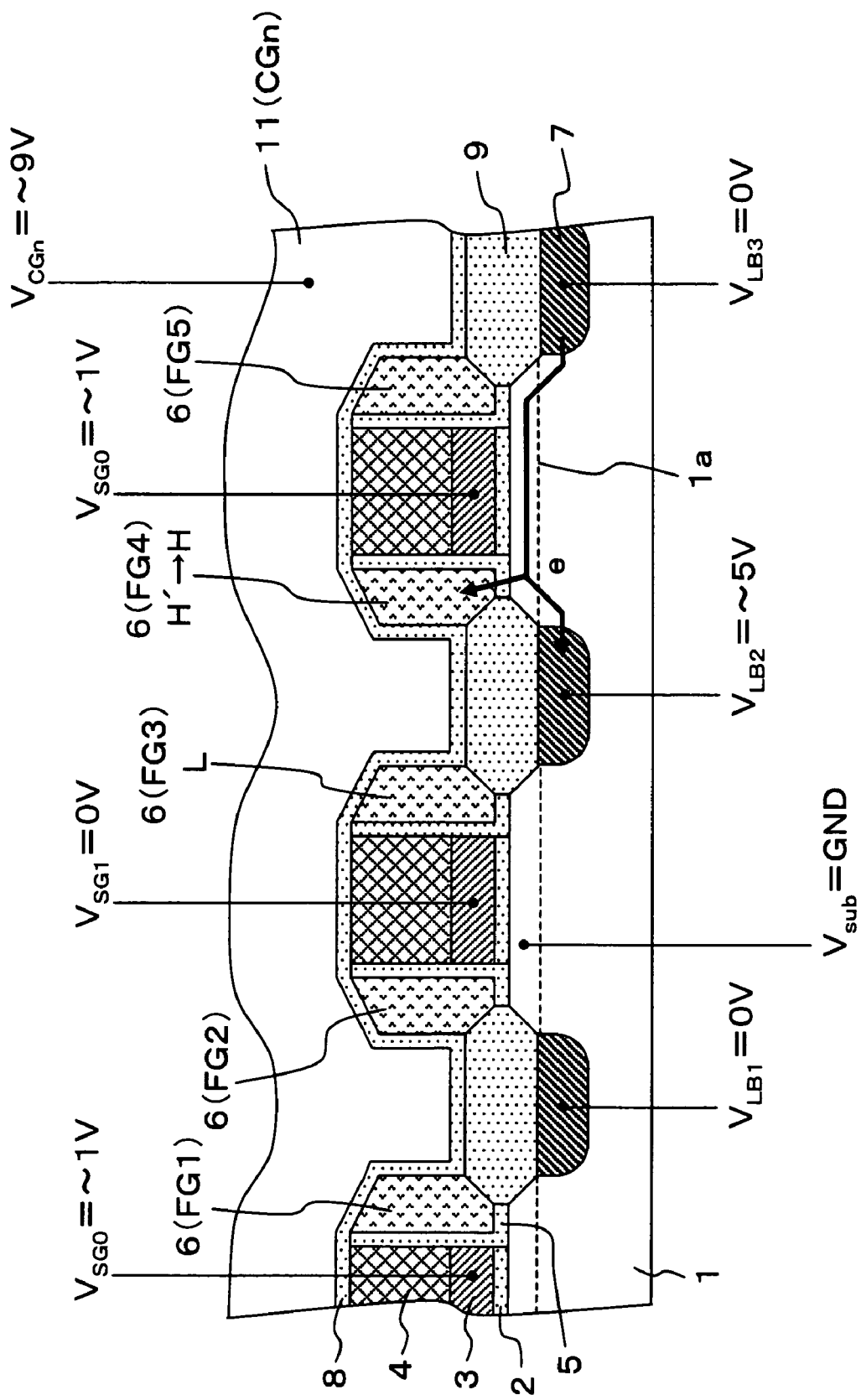
FIG. 6 is a schematic diagram explaining how the semiconductor memory device relating to Example 1 of the present invention changes from the L, H' state to the L, H state.
Figure 7:
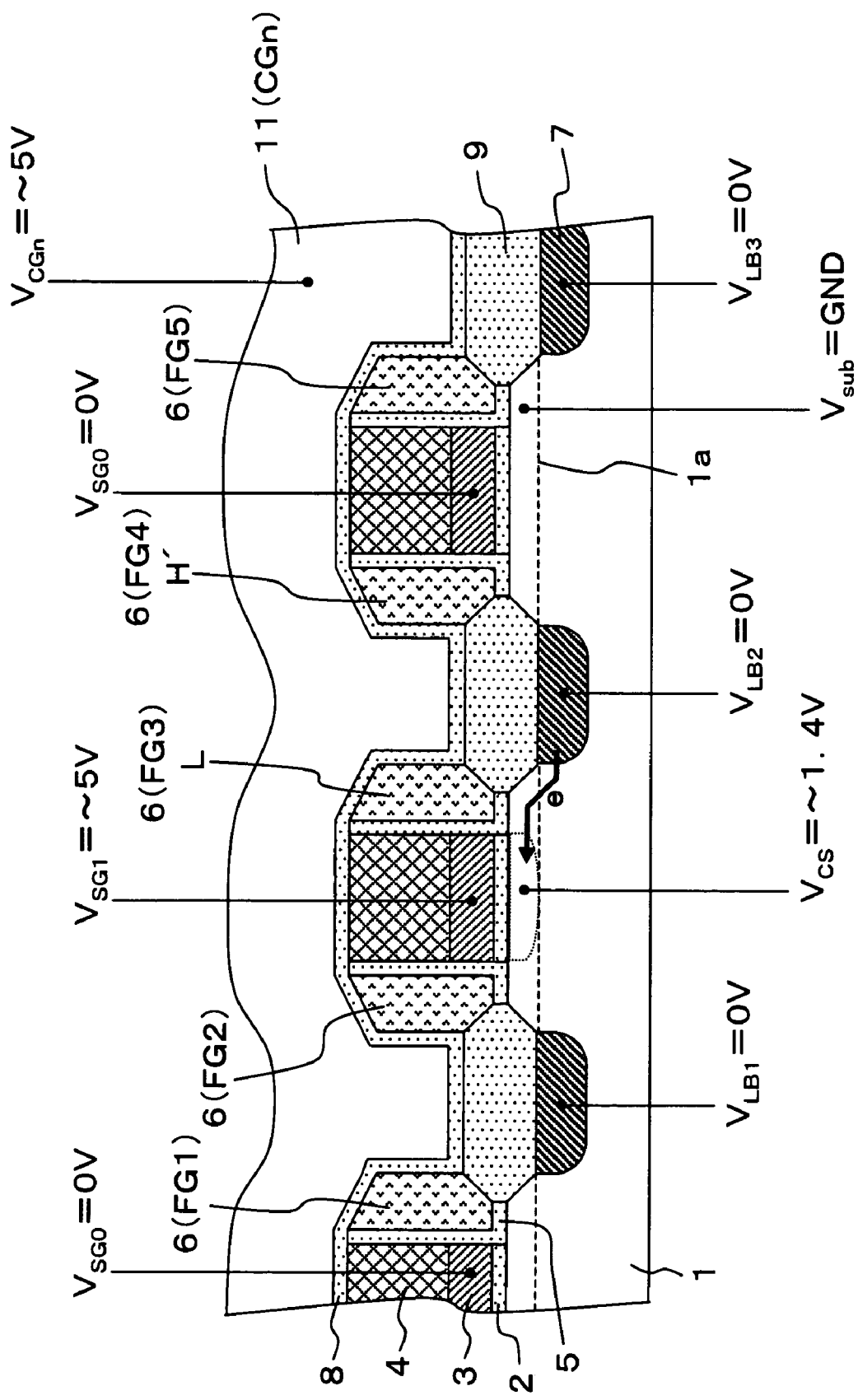
FIG. 7 is a schematic diagram for explaining a verify operation of the semiconductor memory device relating to Example 1 of the present invention.

Next, the operation of the semiconductor memory device relating to Example 1 will be described with reference to the drawings. FIG. 3 is a schematic diagram for explaining how the semiconductor memory device relating to Example 1 of the present invention changes from an initial state to an L, H' state. FIG. 4 is a schematic diagram for explaining how the semiconductor memory device relating to Example 1 of the present invention changes from the L, H' state to an L, L state. FIG. 5 is a schematic diagram for explaining how the semiconductor memory device relating to Example 1 of the present invention changes from the L, L state to an L, H state. FIG. 6 is a schematic diagram for explaining how the semiconductor memory device relating to Example 1 of the present invention changes from the L, H' state to the L, H state. FIG. 7 is a schematic diagram for explaining the verify operation of the semiconductor memory device relating to Example 1 of the present invention. Here, "L" indicates a cell in a low threshold voltage state, "H" a high threshold voltage state, and "H'" indicates a cell in a semi-high threshold voltage state—a state close to the high threshold voltage state. Further, the initial state may be the high threshold voltage state or the low threshold voltage state as long as the threshold voltage state of each cell is higher than the lower limit value of the low threshold voltage (for instance a depletion state).

[Initial State to (L, H') State to (L, L) State to (L, H) State]

The programming operation in which the initial state is changed to the L, H state will be described. Here, a case where the initial state is the H, H state will be described. For instance, when a control gate 11 (CGn) is selected, a floating gate FG3 is written (programmed) to L, and FG4 is written (programmed) to H, the following operation is performed.

Figure 8:
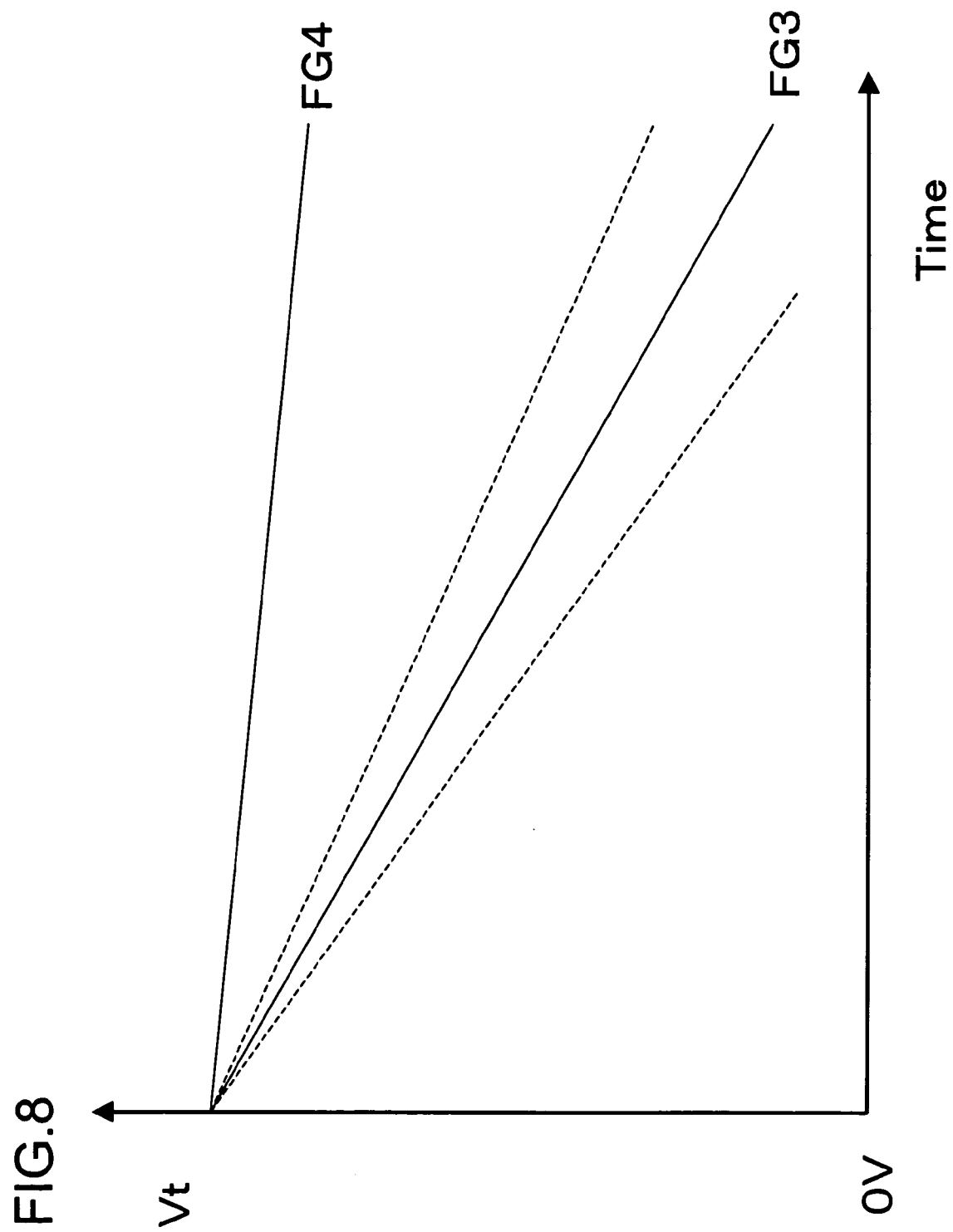
FIG. 8 is a graph schematically showing how threshold voltages change over time during a programming operation of the semiconductor memory device relating to Example 1 of the present invention.
Figure 9A:
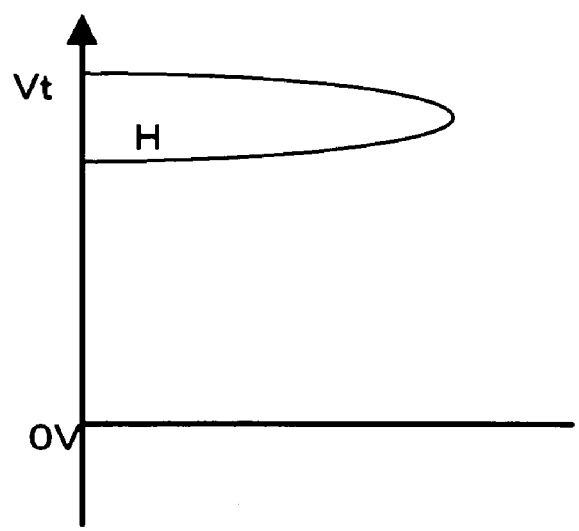
FIGS. 9A, 9B and 9C are schematic diagrams showing the threshold voltage dispersions of memory cells in the semiconductor memory device relating to Example 1 of the present invention.
Figure 9B:
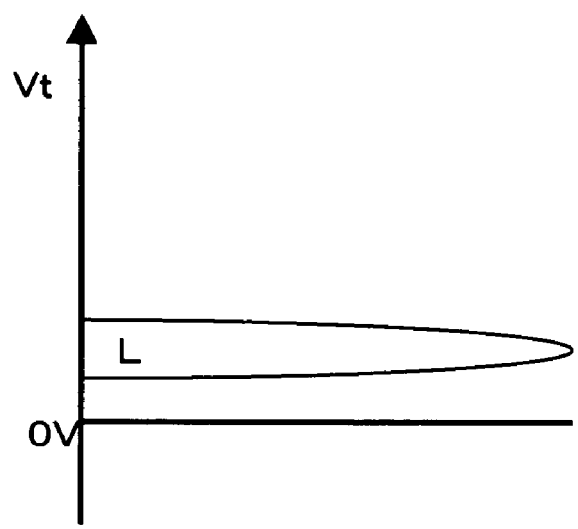
Figure 9C:
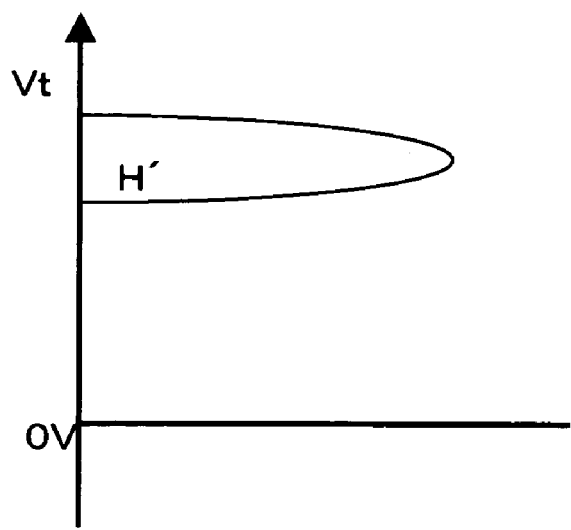
Figure 11:
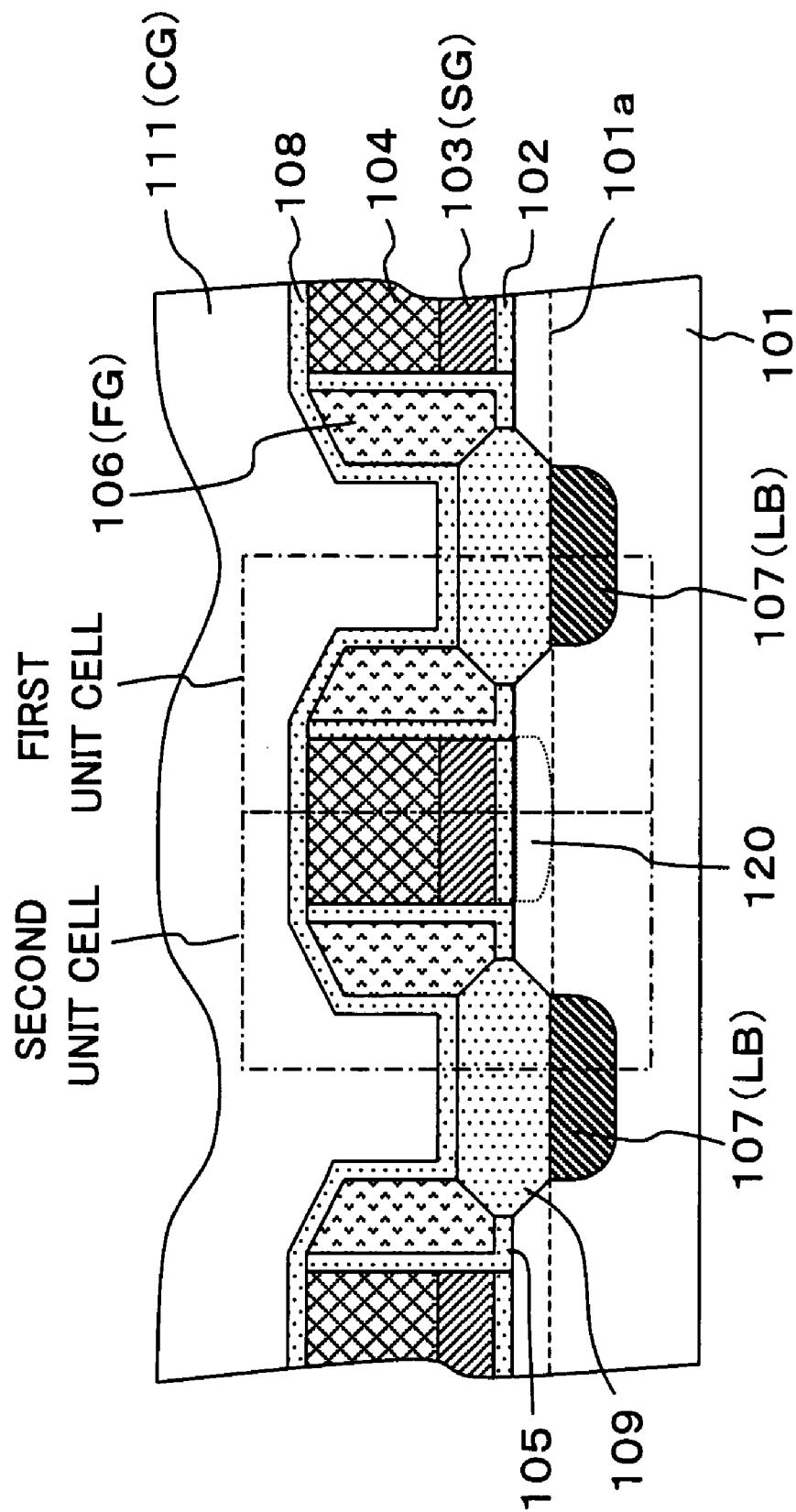
FIG. 11 is a partial cross-sectional view taken along a line Y-Y' in FIG. 10 schematically showing the structure of the semiconductor memory device relating to Related Art 1.

Referring to FIG. 3, by applying a negative voltage (for instance $V_{CGn}=-9V$) to CGn, a positive voltage (for instance $V_{SG0}=2V$) to SG0 on the FG4 side, a voltage $V_{SG1}$ lower than $V_{SG0}$ (for instance $V_{SG1}=0V$) to SG1 on the FG3 side, and a positive voltage (for instance $V_{LB2}=3$ to 5V) to a first diffusion region 7 (LB2) between FG3 and FG4, electrons e are drawn out of FG3 to LB2 through F-N (Fowler-Nordheim) tunneling to set FG3 to the low threshold voltage state (L; refer to FIG. 9B). How the threshold voltages of FG3 and FG3 change over time at this time is shown in FIG. 8, and bits can be selectively controlled since the electrons e drawn from FG4 can be suppressed in number due to the positive voltage applied to SG0 on the FG4 side. Further, the threshold voltage state of FG4 at this time is the semi-high threshold voltage state (H'; refer to FIG. 9C).

Further, in this operation, 0V is applied to unselected control gates 11 (CG1, CG2, etc.) and unselected first diffusion regions 7 (LB1, LB3, etc.), and the substrate 1 (the well 1a) is open. The voltages are applied in two or more separate pulses (for instance 1 ms) and the state of FG3 is verified so that a desired (low) threshold voltage is achieved. The applications of the pulses and the verification are performed alternately. In the verify operation, referring to FIG. 7, by applying 5V to the selected control gates 11 (CGn) (0V to the unselected control gates 11 (CG1, CG2, etc.)), 5V to SG1 (0V to SG0), 1.4V to the second diffusion regions (21 in FIG. 1; CS), and 0V to the first diffusion regions 7 (LB1, LB2, LB3, etc.), the threshold voltage state of FG3 and the reference cell (not shown in the drawing) in the drive circuit (22 in FIG. 1) connected to the first diffusion regions 7 (LB1, LB2, LB3, etc.) are compared by the sense amplifier (not shown in the drawing) in the drive circuit (22 in FIG. 1), and whether or not the threshold voltage of FG3 has reached a target voltage is determined by whether or not the electrons e flow through a channel underneath FG3. At a stage when the electrons e start to flow in a channel underneath FG3, it is determined that the threshold voltage of FG3 has reached the target voltage, and the application of the pulse ends. By this operation, the distribution of the low threshold voltage of FG3 can be set narrow (refer to FIG. 9B). Further, a desired low threshold voltage state can be achieved even when there is variance in the characteristics of memory cells.

Next, referring to FIG. 4, the voltages applied (in FIG. 3) to SG0 and SG1 are reversed, and a desired low threshold voltage is similarly set for FG4. In other words, by applying a negative voltage (for instance $V_{CGn}=-9V$) to CGn, a positive voltage (for instance $V_{SG1}=2V$) to SG1 on the FG3 side, a voltage $V_{SG0}$ lower than $V_{SG1}$ (for instance $V_{SG0}=0V$) to SG0 on the FG4 side, and a positive voltage (for instance $V_{LB2}=3$ to 5V) to the first diffusion region 7 (LB2) between FG3 and FG4, the electrons e are drawn from FG4 to LB2 through F-N tunneling, to set FG4 to the low threshold voltage state (L; refer to FIG. 9B). At this time, since FG3 is already in the low threshold voltage state L, the electric field is practically so low as not to cause the F-N tunneling does not occur, the threshold voltage for FG3 does not change.

Further, in this operation, 0V is applied to unselected control gates 11 (CG1, CG2 etc.) and unselected first diffusion regions 7 (LB1, LB3 etc.), and the substrate 1 (the well 1a) is open. The voltages are applied in two or more separate pulses (for instance 1 ms) and the state of FG4 is verified so that a desired low threshold voltage is achieved. By this operation, the distribution of the low threshold voltage of FG4 can be set narrow (refer to FIG. 9B). Further, when FG3 is written (programmed) to L and FG4 is, written (programmed) to L, the operation ends here.

Lastly, referring to FIG. 5, by selectively injecting electrons into FG4, which is desired to be in the high threshold voltage state H, it is put in the high threshold voltage state. For instance, by applying a positive voltage (for instance $V_{CGn}$=9V) to CGn, $V_{SG1}$=0V to SG1 on the FG3 side, a positive voltage (for instance $V_{SG0}$=1V) to SG0 on the FG4 side, a positive voltage (for instance $V_{LB2}$=5V) to the first diffusion region 7 (LB2), and 0V to the other first diffusion regions 7 (LB1, LB3, etc.), the electrons e run through a channel below the selection gate 3 (SG0) from the first diffusion region 7 (LB3) and flow to another first diffusion region 7 (LB2). At this time, since some of the electrons e have high energy due to an electric field at the boundary between the selection gate 3 (SG0) and the floating gate 6 (SG4), they are injected into the floating gate 6 (FG4) through (across) the insulating film 5 (a tunnel oxide film) below the floating gate 6 (FG4). At this point, the operation in which FG3 below the control gate 11 (CGn) is written (programmed) to L and FG4 is written (programmed) to H is complete.

Further, in this operation, the voltages are applied in two or more separate pulses (for instance 1 ms) and the state of FG4 is verified so that a desired (high) threshold voltage is achieved.

[Initial State to (L, H') State to (L, H) State]

Another writing (programming) operation in which the initial state is changed to the (L, H) state will be described. Here, a case where the initial state is the (H, H) state will be described. For instance, when the control gate 11 (CGn) is selected, FG3 is programmed to L, and FG4 is programmed to H, the following operation is performed.

First, referring to FIG. 3, by applying a negative voltage (for instance $V_{CGn}$=−9V) to CGn, a positive voltage (for instance $V_{SG0}$=2V) to SG0 on the FG4 side, a voltage $V_{SG1}$ lower than $V_{SG0}$ (for instance $V_{SG1}$=0V) to SG1 on the FG3 side, and a positive voltage (for instance $V_{LB2}$=3 to 5V) to the first diffusion region 7 (LB2) between FG3 and FG4, the electrons e are drawn from FG3 to LB2 through F-N tunneling so as to set FG3 to the low threshold voltage state (L; refer to FIG. 9B). How the threshold voltage states of FG3 and FG3 change over time at this time is shown in FIG. 8, and bits can be selectively controlled since the electrons e drawn from FG4 can be suppressed in number due to the positive voltage applied to SG0 on the FG4 side. Further, the threshold voltage state of FG4 at this time is the semi-high threshold voltage state (H'; refer to FIG. 9C).

Further, in this operation, 0V is applied to unselected control gates 11 (CG1, CG2, etc.) and unselected first diffusion regions 7 (LB1, LB3, etc.), and the substrate 1 (the well 1a) is open. The voltages are applied in two or more separate pulses (for instance 1 ms) and the state of FG3 is verified so that a desired (low) threshold voltage is achieved.

Lastly, referring to FIG. 6, by selectively injecting electrons into FG4, which is desired to be in the high threshold voltage state H, it is put in the high threshold voltage state. For instance, by applying a positive voltage (for instance $V_{CGn}$=9V) to CGn, $V_{SG1}$=0V to SG1 on the FG3 side, a positive voltage (for instance $V_{SG0}$=1V) to SG0 on the FG4 side, a positive voltage (for instance $V_{LB2}$=5V) to the first diffusion region 7 (LB2), and 0V to the other first diffusion regions 7 (LB1, LB3, etc.), the electrons e run through the channel below the selection gate 3 (SG0) from the first diffusion region 7 (LB3) and flow to another first diffusion region 7 (LB2). At this time, since some of the electrons e have high energy due to the electric field at the boundary between the selection gate 3 (SG0) and the floating gate 6 (FG4), they are injected into the floating gate 6 (FG4) through (across) the insulating film 5 (a tunnel oxide film) below the floating gate 6 (FG4). At this point, the operation in which FG3 below the control gate 11 (CGn) is programmed to L and FG4 is programmed to H is complete.

Further, it does not matter which one of the low threshold voltage state or the high threshold voltage state is defined as the written state and which one is defined as the erased state in Example 1.

According to the writing (programming) operation of Example 1, the distribution of low threshold voltages of memory cells set to the low threshold voltage state can be made narrow, and the reliability can be increased by obtaining a sufficient operation margin. The reason is that the setting of the low threshold voltage state for memory cells can be performed for each bit.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a first selection gate disposed in a first region on a substrate;
a first storage node disposed in a second region adjacent to said first region;
a local bit line disposed in a third region adjacent to said second region;
a second storage node disposed in a fourth region adjacent to said third region;
a second selection gate disposed in a fifth region adjacent to said fourth region on said substrate;
a control gate disposed on said first storage node and said second storage node; and
a drive circuit that controls voltages applied to said substrate, said first selection gate, said local bit line, said second selection gate, and said control gate; wherein
said drive circuit performs a first control to selectively draw electrons out of said first storage node to said local bit line through F-N tunneling by respectively applying a negative voltage to said control gate, a positive voltage to said second selection gate, a voltage lower than the voltage applied to said second selection gate to said first selection gate, and a positive voltage to said local bit line during a writing operation.

2. The semiconductor memory device as defined in claim 1, wherein said drive circuit performs a second control to selectively draw electrons from said second storage node to said local bit line through F-N tunneling by respectively applying a negative voltage to said control gate, a positive voltage to said first selection gate, a voltage lower than the voltage applied to said first selection gate to said second selection gate, and a positive voltage to said local bit line after said first control.

3. The semiconductor memory device as defined in claim 2, wherein said drive circuit performs a third control to selectively inject electrons into said first storage node or said second storage node by controlling said voltages after said second control.

4. The semiconductor memory device as defined in claim 1, wherein said drive circuit performs a fourth control to selectively inject electrons into said second storage node by controlling said voltages after said first control.

5. The semiconductor memory device as defined in claim 1, wherein said drive circuit applies voltages in two or more separate pulses, verifies the state of said first storage node, and adjusts said state to a desired threshold voltage at the time of said first control.

6. The semiconductor memory device as defined in claim 2, wherein said drive circuit applies voltages in at least two separate pulses, verifies the state of said second storage node, and adjusts said state to a desired threshold voltage at the time of said second control.

7. The semiconductor memory device as defined in claim 5, wherein said verification of the state is performed after application of each pulse.

8. The semiconductor memory device as defined in claim 6, wherein said verification of the state is performed after application of each pulse.

9. A semiconductor memory device comprising:
a first selection gate disposed in a first region on a substrate;
a first storage node disposed in a second region adjacent to said first region;
a local bit line disposed in a third region adjacent to said second region;
a second storage node disposed in a fourth region adjacent to said third region;
a second selection gate disposed in a fifth region adjacent to said fourth region on said substrate;
a control gate disposed on said first storage node and said second storage node; and
a drive circuit that controls voltages applied to said substrate, said first selection gate, said local bit line, said second selection gate, and said control gate; wherein
said drive circuit comprises:
means for controlling to respectively apply a negative voltage to said control gate, a positive voltage to said second selection gate, a voltage lower than the voltage applied to said second selection gate to said first selection gate, and a positive voltage to said local bit line during a writing operation, thereby performing a first control to selectively draw electrons out of said first storage node to said local bit line.

10. The semiconductor memory device as defined in claim 9, wherein said drive circuit comprises:
means for controlling to respectively apply a negative voltage to said control gate, a positive voltage to said first selection gate, a voltage lower than the voltage applied to said first selection gate to said second selection gate, and a positive voltage to said local bit line after said first control, thereby performing a second control to selectively draw electrons from said second storage node to said local bit line.

11. The semiconductor memory device as defined in claim 10, wherein said drive circuit comprises:
means for performing a third control to selectively inject electrons into said first storage node or said second storage node by controlling said voltages after said second control.

12. The semiconductor memory device as defined in claim 9, wherein said drive circuit comprises:
means for a fourth control to selectively inject electrons into said second storage node by controlling said voltages after said first control.

13. The semiconductor memory device as defined in claim 9, wherein said drive circuit comprises:
means for controlling to apply voltages in two or more separate pulses; means for verifying the state of said first storage node; and means for adjusting said state to a desired threshold voltage at the time of said first control.

14. The semiconductor memory device as defined in claim 10, wherein said drive circuit comprises:
means for controlling to apply voltages in two or more separate pulses; means for verifying the state of said second storage node; and
means for adjusting said state to a desired threshold voltage at the time of said second control.

15. The semiconductor memory device as defined in claim 9, wherein said drawing electrons out of said first storage node to said local bit line is conducted through F-N tunneling.

16. The semiconductor memory device as defined in claim 10, wherein said drawing electrons out of said second storage node to said local bit line is conducted through F-N tunneling.

17. The semiconductor memory device as defined in claim 13, wherein said verification of the state is performed after application of each pulse.

18. The semiconductor memory device as defined in claim 14, wherein said verification of the state is performed after application of each pulse.

19. A programmable nonvolatile memory device comprising the semiconductor memory device as defined claim 1.

20. A programmable nonvolatile memory device comprising the semiconductor memory device as defined claim 9.

* * * * *